(12) United States Patent
Wächter et al.

(10) Patent No.: US 12,154,997 B2
(45) Date of Patent: Nov. 26, 2024

(54) THIN FILM SOLAR MODULE AND PRODUCTION METHOD

(71) Applicant: First Solar, Inc., Tempe, AZ (US)

(72) Inventors: Rolf Wächter, Schwäbisch Hall (DE);
Tobias Repmann, Alzenau (DE);
Bernd Sprecher, Schwäbisch Hall (DE)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 17/912,712

(22) PCT Filed: Mar. 18, 2021

(86) PCT No.: PCT/EP2021/057013
§ 371 (c)(1),
(2) Date: Sep. 19, 2022

(87) PCT Pub. No.: WO2021/185995
PCT Pub. Date: Sep. 23, 2021

(65) Prior Publication Data
US 2023/0136328 A1    May 4, 2023

(30) Foreign Application Priority Data
Mar. 19, 2020    (DE) ..................... 10 2020 203 510.5

(51) Int. Cl.
*H01L 31/044*    (2014.01)
*H01L 31/0465*    (2014.01)

(52) U.S. Cl.
CPC ................................. *H01L 31/0465* (2014.12)

(58) Field of Classification Search
CPC ....... H01L 31/00–078; Y02E 10/50–60; H02S 40/36
(Continued)

(56) References Cited

U.S. PATENT DOCUMENTS

| | | | | |
|---|---|---|---|---|
| 4,879,251 A | * | 11/1989 | Kruehler | ............... H01L 31/056 136/258 |
| 2004/0035458 A1 | * | 2/2004 | Beernink | ............ H01L 31/0508 136/244 |

(Continued)

FOREIGN PATENT DOCUMENTS

| | | | |
|---|---|---|---|
| DE | 102014116498 A1 | | 5/2015 |
| JP | 2000196121 A | * | 7/2000 |
| KR | 2013080662 A | * | 7/2013 |

OTHER PUBLICATIONS

JP-2000196121-A English (Year: 2000).*
(Continued)

*Primary Examiner* — Bach T Dinh
(74) *Attorney, Agent, or Firm* — MacMillan, Sobanski & Todd, LLC

(57) ABSTRACT

The invention relates to a thin film solar module comprising a monolithic solar cell array (1), including a plurality of solar cells (2) with a layer structure, comprising a rear contact layer (3), a front contact layer (4) and an absorber layer between the rear contact layer and the front contact layer, and an electrical connection structure (6) for electrically serially connecting neighbouring solar cells. The invention also relates to an associated production method. In the thin film solar module according to the invention, the electrical connection structure includes contact strips (7) for electrically serially connecting neighbouring solar cells, wherein the electrical connection structure electrically serially connects two respective solar cells ($2_m$, $2_{m+1}$) that are adjacent to one another in a series connection direction (RS) via one or more contact strips (7). The contact strips run spaced apart from one another and transverse to the series connection direction with a direction component in the series connection direction in connection strip regions (8) of the solar cells. Each contact strip contacts a side (3*a*) of the (Continued)

rear contact layer of the one solar cell facing an absorber layer and a side (4b) of the front contact layer of the other solar cell facing away from an absorber layer, wherein the connection strip regions of the solar cells have connection recesses (9) in the front contact layer and the absorber layer for exposing the side of the rear contact layer facing the absorber layer. The invention also relates to the use of same in thin film solar cell technology.

20 Claims, 7 Drawing Sheets

(58) Field of Classification Search
USPC .................................................. 136/243–265
See application file for complete search history.

(56) References Cited

U.S. PATENT DOCUMENTS

| | | | |
|---|---|---|---|
| 2011/0120553 A1 | 5/2011 | Watai et al. | |
| 2011/0146745 A1* | 6/2011 | Echizenya | H01L 31/0504 136/244 |
| 2011/0265844 A1* | 11/2011 | Storbeck | H01L 31/0504 257/E31.124 |
| 2012/0204930 A1 | 8/2012 | Verdugo | |
| 2012/0234366 A1* | 9/2012 | Lambertz | H01L 31/0463 257/E31.127 |
| 2013/0056758 A1* | 3/2013 | Ziltener | H01L 31/0322 257/E33.056 |
| 2013/0299829 A1 | 11/2013 | Ishikawa | |
| 2015/0129011 A1 | 5/2015 | Huang | |
| 2017/0373252 A1 | 12/2017 | Bosman et al. | |
| 2019/0074390 A1* | 3/2019 | Choi | H02S 30/10 |

OTHER PUBLICATIONS

KR-2013080662-A English (Year: 2013).*
German Patent and Trademark Office, German office action, Application No. 102020203510.5, dated Nov. 23, 2020.
PCT International Search Report and Written Opinion, Application No. PCT/EP2021/057013, dated Jun. 4, 2021.

* cited by examiner

THIN FILM SOLAR MODULE AND PRODUCTION METHOD

CROSS-REFERENCE TO RELATED APPLICATIONS

This is a national phase application of international application PCT/EP2021/057013, filed on Mar. 18, 2021, and claims priority to German Patent Application No. 102020203510.5, filed on Mar. 19, 2020, each of which is incorporated by reference in the entirety.

The invention relates to thin film solar modules having a monolithic solar cell array that includes a plurality of solar cells having a layer structure complex that comprises a rear contact layer, a front contact layer, and an absorber layer between the rear contact layer and the front contact layer, and having an electrical connection structure for electrically connecting in series solar cells arranged adjacent to one another and an associated production method.

Such thin film solar modules are known in many types of embodiments. The absorber layer functions as a photovoltaically active layer, the front contact layer and the rear contact layer are used as electrical connections for the transport of the electrical charges generated and separated in the absorber layer by the photovoltaic effect. In addition to these three layers, the layer structure usually comprises one or more further layers, such as a buffer layer, a barrier layer, etc., which are not of interest here and are therefore not specifically mentioned.

In the present case, the front contact layer and the rear contact layer mean both the actual front contact layer or rear contact layer that adjoins the absorber layer over the entire surface and any additional electrical contact structures that can typically be provided on the front contact layer or the rear contact layer on its side facing away from the absorber layer in order to topromote electrical connection of the solar cell array to the outside. As usual, the front contact layer means the one of the two electrical contact layers which is on the light incidence side of the solar module or solar cell array, i.e., faces toward the incident light. For this reason, the front contact layer typically consists of a material which has the best possible electrical conductivity and is highly light-transparent, usually a transparent, electrically conductive oxide material, and a so-called contact grid structure having contact fingers made of a highly electrically conductive but light-opaque metal material is applied to this front contact layer. Due to its low ohmic resistance, the contact grid structure is to ensure charge and current transport that is as unobstructed as possible and is uniform over the surface of the solar cell array and reduces the usable light incidence surface for the absorber layer as little as possible.

Due to the electrical connection structure, solar cells of the solar cell array arranged adjacent to one another are electrically serially connected, i.e., electrically connected in series. By designing the electrical connection structure appropriately, any number of the solar cells present in the solar cell array, up to all solar cells of the array, can be electrically connected in series. In corresponding designs of a thin film solar module, blocks of cells connected in series in this way of one array or of two separate arrays can in turn be electrically connected in parallel.

For this purpose, it is known as a monolithically integrated design of the electrical connection structure to connect the rear contact layer of a respective solar cell to the front contact layer of an adjacent solar cell by means of a connection layer structure or contact layer structure, which is formed during the formation of the solar cell array by appropriate layer formation and layer structuring processes, for example simultaneously with the front contact layer and using the layer material used for the front contact layer. To produce this monolithically integrated electrical connection structure for connecting the solar cells in series, the so-called P1-P2-P3 structuring technique is common, for example, as described in, among other documents, patent specification DE 199 34 560 B4 and in the textbook "Handbook of Photovoltaic Science and Engineering", 2nd edition, pages 585 to 587, ISBN 978-0-470-72169-8.

Published application US 2017/0373252 A1 discloses an organic thin film solar cell array having monolithically integrated series connection of the solar cells, in which the absorber layer consists of an organic material and the rear and front contact layers consist of an electrically conductive polymer material, which can be transformed into electrically insulating material by heating by means of laser radiation, which is used therein to produce corresponding insulation regions in the manner of a P1-P2-P3 structure for separating adjacent solar cells and for insulating electrical connection structures from adjacent, electrically conductive layer regions. Contact strips are formed there for the series connection of the cells, which extend in the series connection direction over the front contact layer of two adjacent cells, wherein the respective contact strip directly contacts the front contact layer of one cell and is electrically insulated from the active front contact and absorber layer region of the other cell by means of side insulation regions and extends via a contact hole formed there to the rear contact layer.

Published application US 2012/0204930 A1 discloses a thin film solar module using a P1-P2-P3 structuring technology in which rectangular connection regions for series connection of the solar cells are provided as an alternative to conventional continuous structuring lines.

A person skilled in the art is familiar with the fact that the dimensioning or the design of the solar cells and their series connection structure in thin film solar modules has a significant influence on the efficiency of the module. It has been shown that the efficiency as a function of the cell width, i.e., the longitudinal extension of the respective solar cell in the series connection direction, typically has a progression which has a maximum at a specific cell width and decreases therefrom on both sides, i.e., with decreasing or increasing cell width, wherein the position of this efficiency maximum depends on the other module parameters and is usually at a cell width in the range between approximately 0.2 cm and approximately 1 cm. Corresponding studies and results can be found, for example, in the journal article by Y. Gupta et al., Optimization of a-Si Solar Cell Current Collection, Proc. of the 16th IEEE Photovoltaic Specialists Conf., p. 1092, 1982.

In an alternative connection technology, each two solar cells are electrically connected in series by means of externally attached contact strips made of a metallic, highly electrically conductive wire or tape material in that the respective contact strip is attached along the rear side of one solar cell and along the front side of the other solar cell, wherein it is guided from the rear side to the front side between the two adjacent solar cells, for which purpose the two solar cells leave a corresponding passage gap between them. This connection technology is particularly suitable for thin film solar modules in a flexible design without a rigid carrier substrate on the rear side or for designs in which the rear contact layer can or should be electrically contacted from the module rear side. This connection technology is disclosed, for example, in the dissertation "Siebdruck der Frontseitenmetallisierung und der Klebeflächen für Zellverbinder auf a-Si: H/c-Si-Heterojunction-Solarzellen [Screen printing of the front side metallization and the adhesive surfaces for cell connectors on a-Si: H/c-Si heterojunction solar cells]" by R. Friedrich, pages 14 and 15 and in published patent applications EP 1 708 281 A2, EP 1 748 495 A1, and WO 2006/101741 A2.

A further conventional thin film solar module having a series connection of solar cells placed adjacent to one another using contact strips is disclosed in published application DE 10 2014 116 498 A1, wherein the contact strips for contacting the rear contact layer are guided here on the front side in openings of the relevant solar cell that are close to the edge and expose the rear contact layer.

The technical problem of the invention is the provision of a thin film solar module of the type mentioned at the outset, which can be manufactured with comparatively little effort, enables high solar module efficiency, has low current transport losses, and, if required, permits relatively small module voltages to be achieved by connecting in series comparatively few and comparatively large-area solar cells allowed, and an advantageous method for producing such a thin film solar module.

The invention solves this problem by providing a thin film solar module having the features of claim 1 and a production method having the features of claim 10. Advantageous refinements of the invention are specified in the dependent claims.

In the thin film solar module according to the invention, the electrical connection structure contains contact strips for the electrical series connection of solar cells arranged adjacent to one another, wherein the electrical connection structure electrically connects in series each two solar cells adjoining in a series connection direction to one another by one or more contact strips. The contact strips are arranged spaced apart transversely to the series connection direction and extend with a directional component in the series connection direction in connecting strip regions of the solar cells, i.e., they extend in parallel or at an acute angle of less than 90° to the series connection direction. Each contact strip contacts a side of the rear contact layer of one solar cell facing toward the absorber layer and a side of the front contact layer of the other solar cell facing away from the absorber layer, wherein the connecting strip regions of the solar cells have connecting openings in the front contact layer and the absorber layer to expose the side of the rear contact layer facing toward the absorber layer. The respective connecting opening can be formed, for example, by a continuous connecting trench or by one or more spaced-apart via openings. By arranging multiple contact strips spaced apart from one another for the series connection of the respective two solar cells, good charge or current transport can be ensured even in the case of larger-area solar cells. The possibility similarly contributes to this that the respective contact strip can extend over any desired length in the region of the respective solar cell along the series connection direction in which the two serially connected solar cells are arranged adjacent to one another. Accordingly, the contact strip can extend over a significant part of the extension of the solar cells in this series connection direction, and its extension is in particular not restricted to an edge region of the solar cell. This contributes to minimizing the ohmic resistances of the current-conducting structures of the module. Since the contact strips contact the rear contact layer of the relevant solar cell on its side facing toward the absorber layer, the rear contact layer does not have to be accessible from the rear from its side facing away from the absorber layer. In many cases it is preferred if the contact strips extend in parallel to the associated series connection direction of the solar cells, but depending on requirements and application, it can alternatively be favorable if the contact strips do not extend exactly in parallel to this series connection direction, but at an angle thereto.

According to one aspect of the invention, the respective contact strip extends in the connecting strip region on the front contact layer of one solar cell and in a connecting trench of the other solar cell that forms the connecting opening and contacts the rear contact layer of the other solar cell continuously along its extension over the rear contact layer, wherein it extends between the associated solar cells over the separating strip region separating them, with an insulating layer interposed. In the present context, continuous contacting means that the contact strip in the connecting trench continuously abuts the rear contact layer with touch contact, so that in principle a corresponding continuous electrical contact is also provided if electrically conductive materials are used. If required, the electrical contacting can be additionally reinforced or assisted at certain points, for example by using ultrasonic spot welds or the like. The respective contact strip is attached as a prefabricated wire or tape material and/or its contact surface to the rear contact layer has a length/width ratio of at least 3:1, preferably at least 5:1 or at least 10:1 or at least 30:1 or at least 100:1. Additionally or alternatively to this length/width dimensioning of the contact strip, the connecting trench can likewise have a length/width ratio of at least 3:1, preferably at least 5:1 or at least 10:1 or at least 30:1 or at least 100:1. In this embodiment, the insulating layer prevents the contact strip in the separating strip region from inadvertently electrically contacting a side flank that is exposed in the separating strip region, i.e., an edge side or narrow side, of the rear contact layer and/or the absorber layer of the solar cell, the front contact layer of which it contacts.

According to a further aspect of the invention, which can be provided additionally or alternatively to the first mentioned aspect, the respective contact strip extends in the connecting strip region on the front contact layer of one solar cell and, with an insulating layer interposed, over the front contact layer of the other solar cell and contacts the rear contact layer of the other solar cell along its extension in one or more contact sections spaced apart from one another, in which the connecting opening in the connecting strip region forms a corresponding via opening in each case through the insulating layer, the front contact layer, and the absorber layer. The via openings through which the contact strip contacts the rear contact layer are provided on the contact sections, i.e., contact points. In this case, if required, the insulating strip material can also be introduced as an electrically insulating material into the separating strip regions which separate the individual solar cells or their rear contact layer regions from one another.

These aspects of the invention represent advantageous alternatives for the electrical and typically also mechanical connection of the respective contact strip to the rear contact layer of the relevant solar cell. A continuous contact results in a correspondingly large contact surface, a quasi-punctiform contact on one or more spaced-apart contact sections or contact pads is usually associated with a lower loss of active solar cell surface, especially when a light-transparent material is selected for the insulating layer, since the photovoltaically active region between the contact pads extends directly to the respective contact strips. The punctiform contact can possibly also have manufacturing advantages.

The insulating layer between the rear contact layer and the respective contact strip consists of an electrically insulating and preferably light-transparent material and can be implemented, for example, as a separately prefabricated insulating strip or as a paste material or structured layer made of a corresponding material.

With each of these aspects, this electrical connecting structure according to the invention represents an advantageous connection concept for connecting in series the solar cells of the monolithic solar cell array. The connection concept enables an optimum compromise between losses of photovoltaically usable light incidence surface and electrical resistance losses. Current transport losses can be kept to a minimum, and the efficiency of the individual solar cells can be transferred to the overall module with very high efficiency. i.e., can be retained for the entire module. The connection structure can be manufactured with relatively little effort and enables a series connection of conventionally monolithically connected solar cells that are only separated from one another by appropriate separating or structuring lines. The solar cells can have a relatively large area in order to achieve a module voltage that remains relatively low as the sum of the individual voltages of the solar cells connected in series for a given total cell surface. In particular, it has been shown that this connection concept enables modules having solar cells of relatively large cell width, also referred to here as cell breadth, in the series connection direction with relatively high module efficiency at the same time, i.e., efficiency of the solar module in terms of its photoelectric conversion capacity. The invention can be used for thin film solar modules of the CIGS (Copper Indium Gallium Diselenide) type and for thin film solar modules of other conventional types.

In one refinement of the invention, a cell breadth, i.e., cell width of the respective solar cell in the series connection direction is at least 2 cm, in particular at least 3 cm. This is a relatively large cell width in comparison to conventional cell widths. Nevertheless, due to the special series connection measures according to the invention, the invention makes it possible to achieve an efficiency of the thin film solar module of at least 14%, in particular at least 16%. Additionally or alternatively, a maximum of the efficiency of the thin film solar module as a function of a cell width of the respective solar cell in the series connection direction is in a range of the cell width between 2 cm and 10 cm, and/or the efficiency of the thin film solar module as a function of the cell width of the respective solar cell in the series connection direction varies in the range of the cell width between 2 cm and 20 cm by at most 20% in relative terms, in particular by at most 10% in relative terms.

In other words, this refinement enables providing a module having a relatively large cell width and at the same time relatively high efficiency, wherein the cell width may also be varied within a relatively large range, especially also in the direction of increasing cell width, without reducing the efficiency so much that the module is no longer appears suitable for practical use. As a rule, the cell width of all solar cells in the module is chosen to be uniform in size, but for corresponding applications it is also possible to choose the cell width of at least one solar cell to be different from the cell width of at least one other solar cell of the module, wherein then the above-mentioned dimensioning specifications for the cell width apply in such refinements of the invention for at least one of the solar cells of the module, preferably for a majority of all cells and preferably for all cells.

In one refinement of the invention, a first and a third solar cell adjoin a second solar cell on opposite sides, wherein the first and the second solar cell are electrically connected in series by one or more first contact strips and the second and the third solar cell are electrically connected in series by one or more second contact strips. Each of the first contact strips contacts the side of the rear contact layer of the first solar cell facing toward the absorber layer and the side of the front contact layer of the second solar cell facing away from the absorber layer, and each of the second contact strips contacts the side of the rear contact layer of the second solar cell facing toward the absorber layer and the side of the front contact layer of the third solar cell facing away from the absorber layer, wherein, in the region of the second solar cell, at least one first and one second contact strip extend overlapping in the direction transverse to the series connection direction.

This refinement offers an advantageous foundation for series connection of any number of solar cells in a corresponding string, i.e., a chain-like sequence of serially connected solar cells in the monolithic solar cell array. In the region of the respective solar cell, the first and the second contact strips can extend overlapping, i.e., interlocking in a direction transverse to the series connection direction. In particular, any number of solar cells arranged adjacent to one another in a straight line can be connected in series using this refinement. In the region of a respective solar cell, which is electrically connected in series on two opposite sides to a further solar cell in each case, at least one, preferably multiple, and in a particularly advantageous implementation all contact strips that are led to the one adjacent solar cell overlap with the adjacent contact strips, which are led to the other, opposite adjacent solar cell.

As a result, an interlocking, overlapping contact strip structure can be implemented, in which the contact strips leading to a first adjacent solar cell extend into the regions between the contact strips leading to an opposite adjacent second solar cell. This contributes to further optimizing the electrical connection structure for solar cells arranged adjacent to one another in a row and electrically connected in series. In alternative embodiments, the one contact strip, which contacts a solar cell under consideration with a first neighboring solar cell, does not extend into the region between two other adjacent contact strips, with which the solar cell under consideration is electrically connected in series with the adjacent second solar cell lying opposite.

In one embodiment of the invention, the first contact strips are arranged at equal transverse distance from one another in the region of the respective solar cell. This equal transverse distance of the first contact strips from one another generally promotes optimum current consumption or current draw from or into the relevant solar cell and thus optimum current transport over the surface area of the solar cell. In a further embodiment of the invention, the transverse distance of the first contact strips from one another is between 10 mm and 100 mm, which has proven to be optimal in very many applications. Alternatively, in certain cases, the first contact strips can be spaced apart from one another at different transverse distances.

In another embodiment of the invention, the second contact strips are arranged at equal transverse distance from one another. In this case as well, the same transverse distance of the second contact strips from one another is optimum for most cases, but an arrangement of the second contact strips having different transverse distances from one another can alternatively be provided for certain cases. In a further embodiment of the invention, the transverse distance of the second contact strips from one another is between 10 mm and 100 mm, which has proven to be optimal in very many applications.

In still another embodiment of the invention, the first and the second contact strips are arranged alternating at equal transverse distance from one another. This represents a maximally uniform arrangement and distribution of the first and second contact strips on the respective solar cell, wherein in this case the first and second contact strips are preferably arranged in the mentioned interlocking structure. In a further embodiment of the invention, the transverse distance of the first and second contact strips from one another is between 5 mm and 50 mm, which has proven to be optimal in very many applications. Alternatively, an arrangement of the first and second contact strips on the respective solar cell can be provided for certain cases, in which different transverse distances are provided and/or which deviates from the alternating arrangement of the first and second contact strips, for example by arranging each two second contact strips between two first contact strips or by some other sequence of the first and second contact strips in the transverse direction of the solar cell transverse to the series connection direction.

In one refinement of the invention, the solar cell array has a substrate layer on which the solar cells are arranged with their rear contact layer jointly facing toward the substrate layer, wherein each two adjacent and electrically serially connected solar cells are separated from one another in their layer structure by a separating strip region and the contact strips extend beyond their separating strip region for the electrical series connection of the two solar cells. This refinement is suitable for modules having a monolithic interconnection of the solar cell array, which is known per se, in which the individual solar cells are separated from one another by the separating strip regions. In this case, the contact strips extend beyond this separating strip region for the electrical serial connection of two solar cells that are adjacent along the separating strip region.

In one refinement of the invention, the contact strips are components that are manufactured separately from the monolithic solar cell array and attached to the monolithic solar cell array. In this case, the contact strips can be prefabricated as individual contact wires or contact tapes, for example, which are then applied to the solar cells and mechanically and electrically connected to the front contact layer of one solar cell and the rear contact layer of the adjacent solar cell to be connected in series thereto, for example by a soldering process or using an electrically conductive adhesive material. Alternatively, the contact strips can be implemented as electrically conductive thin film strips in a suitable conventional layer formation and layer structuring process for applying and structuring the contact strips.

In one refinement of the invention, the contact strips extend in the region of a respective solar cell with a strip length that is at least 50%, in particular at least 80%, of the longitudinal extension of the solar cell in the extension direction of the contact strips. This relatively long strip length of the contact strips in relation to the longitudinal extension of the solar cell promotes a full-surface and uniform current transport characteristic of the electrical connection structure over the surface area of the solar cells, wherein the ohmic resistances for current transport can be minimized. In exceptional cases, it can alternatively be desirable to choose a shorter extension length of the contact strips.

In one refinement of the invention, the contact strips extend in the region of a respective solar cell with their strip section contacting the front contact layer having a strip length that is less than the longitudinal extension of the solar cell in the extension direction of the contact strips by a shortening distance that is at most twice as large, in particular at most as large as a grid spacing of a contact grid structure of the front contact layer. This measure has the advantage that in these cases, in which the front contact layer has a contact grid structure, the respective contact strip can contact all or almost all contact fingers or contact tracks of this contact grid structure directly, i.e., can be in physical contact with them, which optimizes the charge transport or current transport on the front contact layer and keeps the ohmic resistances low. In exceptional cases, it can alternatively be desirable to choose a shorter extension length of the contact strips, i.e., shorter by more than twice the grid spacing than the longitudinal extension of the solar cell in this direction.

In one embodiment of the invention, the longitudinal extension of the respective solar cell in the extension direction of the contact strips is between 10 mm and 300 mm. This represents optimal dimensioning of the extension of the individual solar cells of the solar cell array for very many applications. Alternatively, however, solar cells with a lesser or greater length extension can also be provided.

In the production method according to the invention, the monolithic solar cell array is first prefabricated, which can be carried out using any conventional production process technologies and production process steps for this purpose familiar to a person skilled in the art. Subsequently, the connecting openings are formed in the front contact layer and the absorber layer in order to expose the rear contact layer in the relevant region, for example, by a typical process for forming trenches or via openings. Then the contact strips are attached, for example, by a layer deposition process or as prefabricated strip material, for example, as individual pieces of wire or contact tapes made of an electrically conductive material, and electrically contacted with the rear contact layer and the front contact layer of the respective associated solar cells. Finally, the thin film solar module is completed by the usual further process steps depending on the desired design type of the module, for example, producing external contact connections and/or for encapsulating the module. Overall, this enables the production of the thin film solar module according to the invention with relatively high production efficiency and relatively low production expenditure.

In one refinement of the invention, to implement the variant in which the respective contact strip extends in the connecting strip region with an insulating layer interposed on the front contact layer and contacts the rear contact layer of the relevant solar cell along its extension in one or more spaced-apart contact sections, before the connecting openings are formed and the contact strips are attached, the insulating layer is applied in the connecting strip regions on the front contact layer, for example by a layer deposition technology or as a prefabricated strip material.

Advantageous embodiments of the invention are shown in the drawings. These and further advantageous embodiments of the invention are described in more detail hereinafter. In the figures:

FIG. 1 shows a top view of a thin film solar module having twenty serially connected solar cells in two rows, FIG. 2 shows a top view of a thin film solar module having forty serially connected solar cells in four rows, FIG. 3 shows a top view of a thin film solar module having sixty serially connected solar cells in six rows.

FIG. 4 a detailed view of a region IV in FIG. 3,

FIG. 5 shows a detailed top view of a thin film solar module of the type from FIGS. 1 to 3 in an embodiment having continuous contacting of contact strips with a rear contact layer, FIG. 6 shows the view from FIG. 5 for an embodiment with punctiform contacting of the contact strips with the rear contact layer, FIG. 7 shows a sectional view along a line VII-VII in FIG. 5, FIG. 8 shows a sectional view along a line VIII-VIII in FIG. 6

Figure 1:
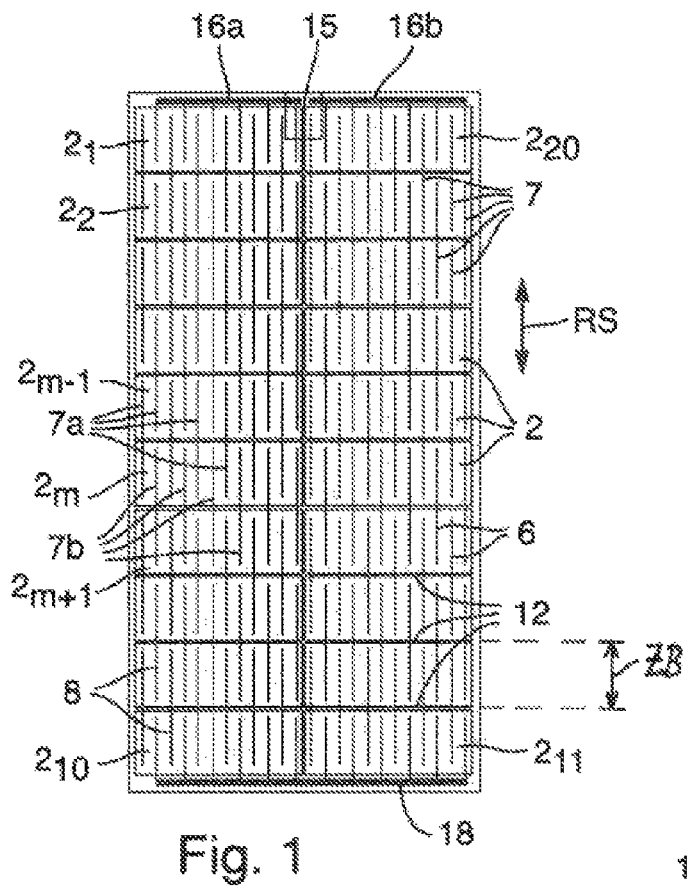

The thin film solar module shown in the figures in different embodiment variants comprises a monolithic solar cell array 1, which includes a plurality of solar cells 2 having a layered structure that has a rear contact layer 3, a front contact layer 4, and an absorber layer 5 between the rear contact layer 3 and the front contact layer 4. Furthermore, the thin film solar module includes an electrical connection structure 6 having contact strips 7 for electrically connecting in series solar cells arranged adjacent to one another, wherein the electrical connection structure electrically connects in series each two solar cells $2_{m-1}$ and $2_m$, $2_m$ and $2_{m+1}$ etc. adjoining in a series connection direction RS by one or, as shown, multiple of the contact strips 7.

Figure 2:
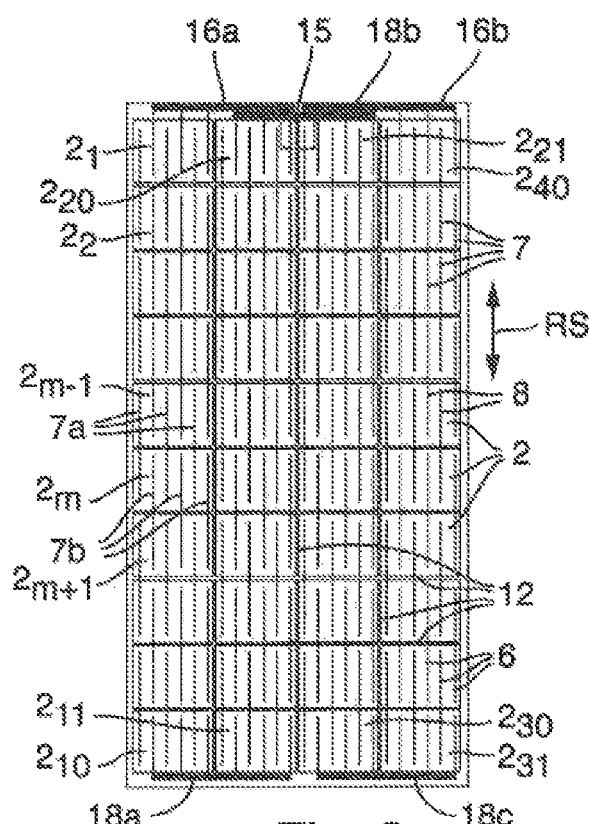
Figure 3:
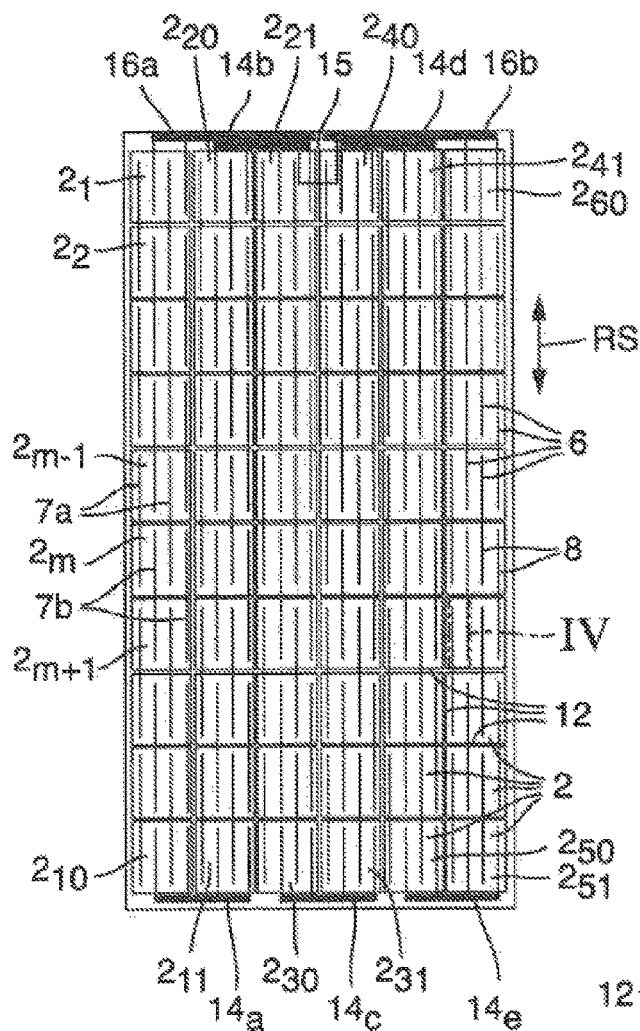

The monolithic solar cell array 1 is divided into the individual solar cells 2 in a manner known per se by means of separating strip regions 12. FIG. 1 illustrates an example in which the solar cell array 1 has a rectangular shape and is divided into two rows of ten solar cells $2_1$ to $2_{10}$ and $2_{11}$ to $2_{20}$ each, wherein the solar cells in each row are arranged adjacent to one another or successively in the mentioned series connection direction RS and are electrically connected in series. In the example shown, the solar cells $2_1$ to $2_{10}$ or $2_{11}$ to $2_{20}$ all have an equal cell width ZB, i.e., longitudinal extension in the series connection direction RS, wherein the cell width ZB can be in the range between 1 cm and 30 cm, in particular in the range between approximately 2 cm and approximately 10 cm. The two rows of solar cells are electrically connected to one another in series via a lateral busbar 18, and a connection socket unit 15 and two connection bars 16a, 16b are located on an opposite array side, also in a conventional manner. FIG. 2 similarly illustrates an example having four series-connected rows of ten series-connected solar cells $2_1$ to $2_{10}$, $2_{11}$ to $2_{20}$, $2_{21}$ to $2_{30}$, $2_{31}$ to $2_{40}$ each, wherein in this case three lateral busbars 18a, 18b, 18c ensure the series connection of the solar cell rows. FIG. 3 illustrates an example having six series-connected rows of ten series-connected solar cells $2_1$ bis $2_{10}$, . . . , $2_{51}$ bis $2_{60}$ each, correspondingly using five busbars 18a to 18e for the series connection of the solar cell rows to one another. In the examples shown, the solar cell array 1 is rectangular, in alternative embodiments it has a different conventional shape. In the rectangular shape of the solar cell array 1 shown, the separating strip regions 12 preferably extend in a grid pattern, so that the solar cell array 1 is divided into rows and columns of solar cells. The series connection direction RS accordingly runs in the row or column direction.

The contact strips 7 are spaced apart from one another transversely to the series connection direction RS and extend with a directional component in the series connection direction RS in connecting strip regions 8 of the solar cells 2. Each contact strip 7 contacts a side 3a of the rear contact layer 3 of one of the solar cells 2 facing toward the absorber layer 5 and a side 4b of the front contact layer 4 of an adjacent other one of the solar cells 2 facing away from the absorber layer 5, wherein the connecting strip regions 8 of the solar cells have connecting openings 9 in the front contact layer 4 and the absorber layer 5 to expose the side 3a of the rear contact layer 3 facing toward the absorber layer.

In an embodiment illustrated in FIGS. 5, 7, and 9 to 12, the respective contact strip 7 continuously contacts the rear contact layer 3 of the relevant solar cell 2 along its extension above the rear contact layer 3. For this purpose, the respective connection recess 9 consists of a one-piece continuous connecting trench 9b in this case. A contact surface of the respective contact strip 7 to the rear contact layer 3 preferably has a length/width ratio of at least 3:1, for example at least 5:1 or at least 10:1 or at least 30:1 or at least 1000:1. For example, the contact strips 7 can have a length between approximately 1 cm and approximately 20 cm and a width between approximately 10 μm and 3000 μm. The respective connecting trench 9b can be dimensioned analogously, for example having a length/width ratio of at least 3:1, preferably at least 5:1 or at least 10:1 or at least 30:1 or at least 1000:1.

In an embodiment illustrated in FIGS. 6, 8, and 13 to 16, the respective contact strip 7 contacts the rear contact layer 3 of the relevant solar cell 2 along its extension over the rear contact layer 3 in one or, as shown, multiple contact sections 14 spaced apart from one another. These contact sections 14 are formed by corresponding via openings 9a in the front contact layer 4 and the absorber layer 5. In this case, the respective connecting opening 9 consists of one or, as shown, multiple of these via openings 9a in the relevant connecting strip region 8. In this case as well, the respective contact strip 7 can have, for example, a length of between approximately 1 cm and approximately 30 cm and a width between approximately 10 μm and approximately 3000 μm or a length/width ratio of at least approximately 3:1, for example, at least approximately 5:1 or at least approximately 10:1 or at least approximately 30:1 or at least 1000:1.

In corresponding implementations, as in the examples shown, the solar cell array 1 has a substrate layer 15 on which the solar cells 2 are jointly arranged, wherein their rear contact layer 3 faces toward the substrate layer 15, especially with a side 3b of the rear contact layer 3 facing away from the absorber layer 5. The substrate layer 15 can be, for example, a typical glass substrate, i.e., glass support, or any other conventional substrate known to those skilled in the art for supporting the solar cell thin film structure.

Each two adjacent and electrically serially connected solar cells $2_{m-1}$ and $2_m$, $2_m$, and $2_{m+1}$ etc. are separated from each other in their layer structure by the separating strip region 12, and the contact strips 7 extend for the electrical serial connection of the respective two solar cells $2m_{-1,2m}$ etc. transversely over their separating strip region 12. In the embodiment of FIGS. 5, 7, and 9 to 12, the separating strip regions 12 are covered by an insulating layer 17 made of electrically insulating material, so that the crossing contact strips 7 do not come into contact there with side flanks of the rear contact layer 3 and the absorber layer 5 that are otherwise exposed there. The insulating layer 17 can be implemented by a conventional layer deposition technology or as a paste material incorporated in or applied to the separating strip regions 12 or prefabricated strip or tape material. In embodiments in which, as in the examples shown, the insulating layer 17 extends not only in the separating strip region 12 itself, but also in an adjacent region of the layer structure of absorber layer 5 and front contact layer 4, the insulating layer 17 is expediently made of a transparent material, i.e., a material that is transparent to light, which is relevant to the photovoltaic function of the solar cells 2 in the present case.

Figure 8:
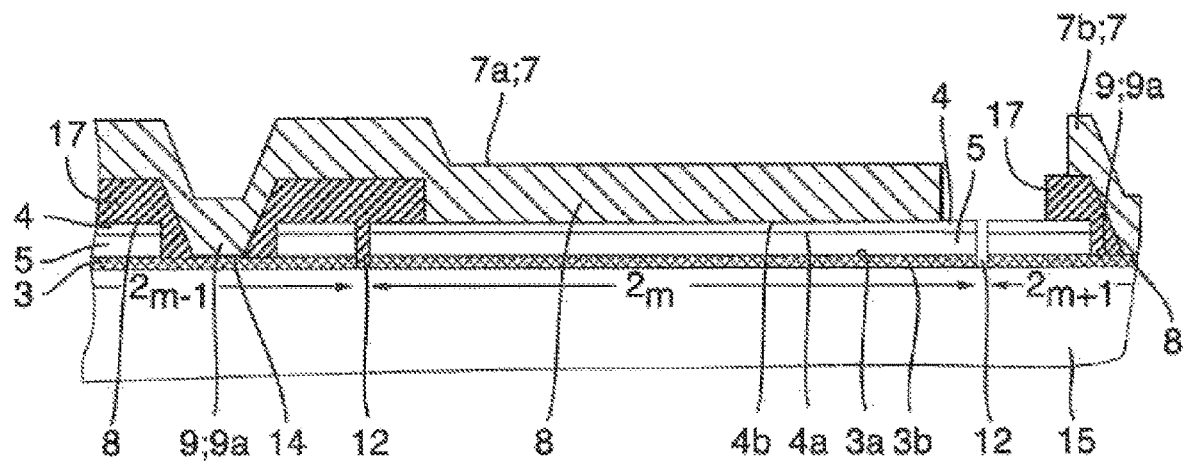
Figure 9:
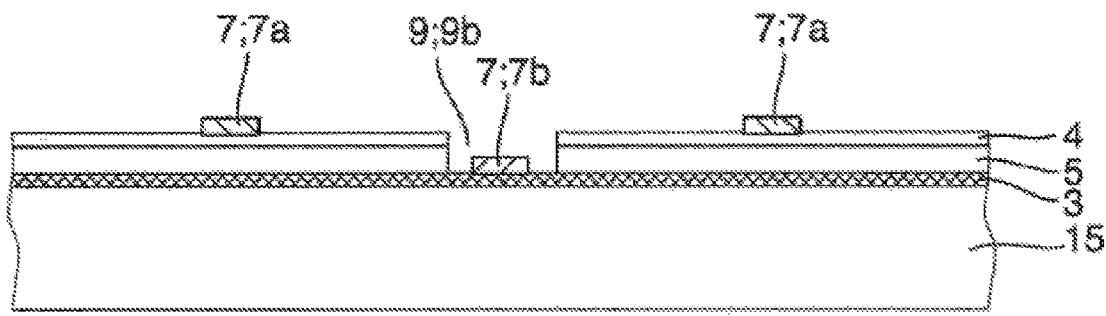
FIG. 9 shows a sectional view along a line IX-IX in FIG. 5.
Figure 10:
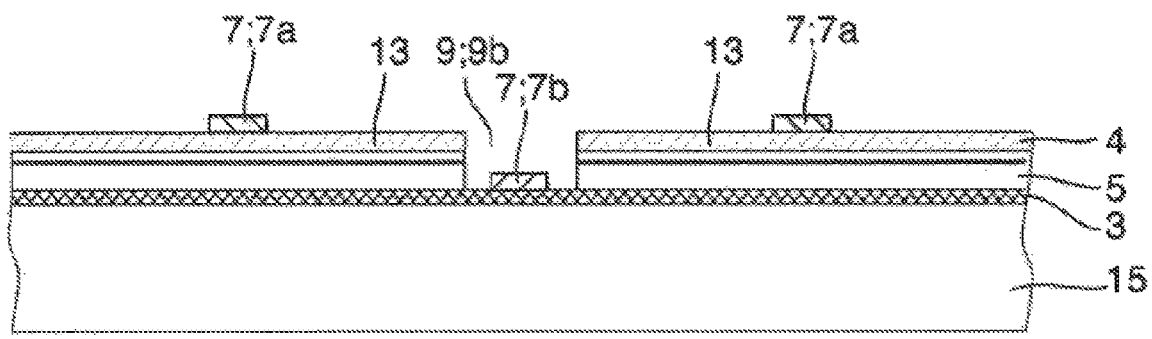
FIG. 10 shows a sectional view along a line X-X in FIG. 5.
Figure 11:
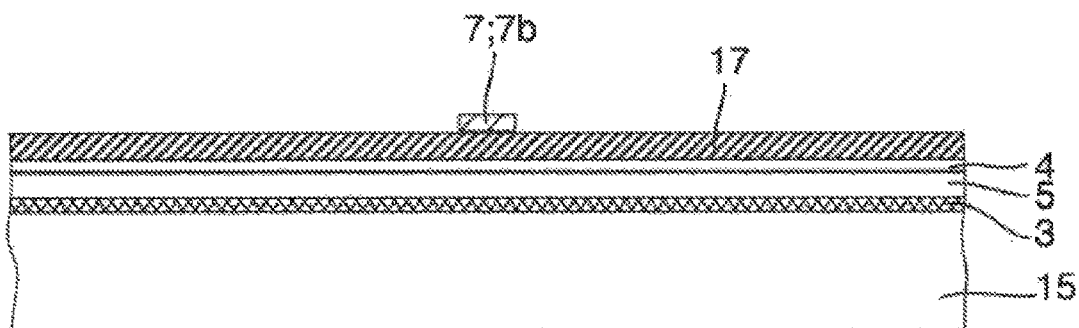
FIG. 11 shows a sectional view along a line XI-XI in FIG. 5.
Figure 12:
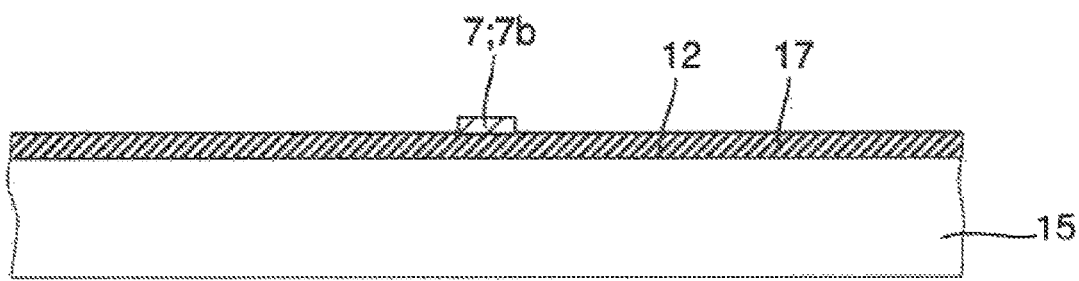
FIG. 12 shows a sectional view along a line XII-XII in FIG. 5.
Figure 13:
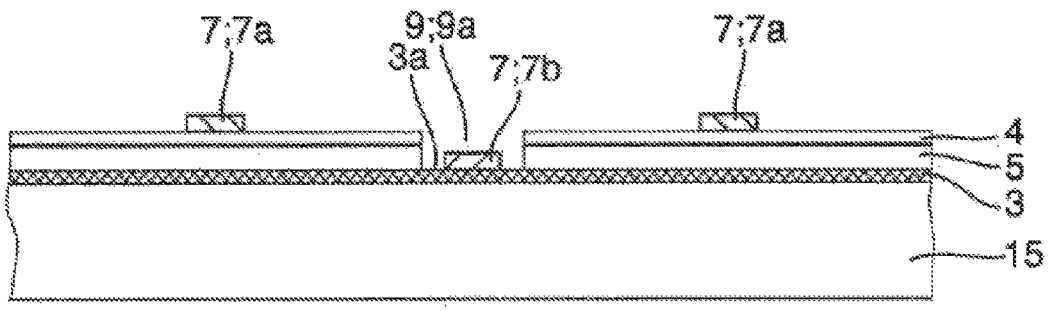
FIG. 13 shows a sectional view along a line XIII-XIII in FIG. 6.
Figure 14:
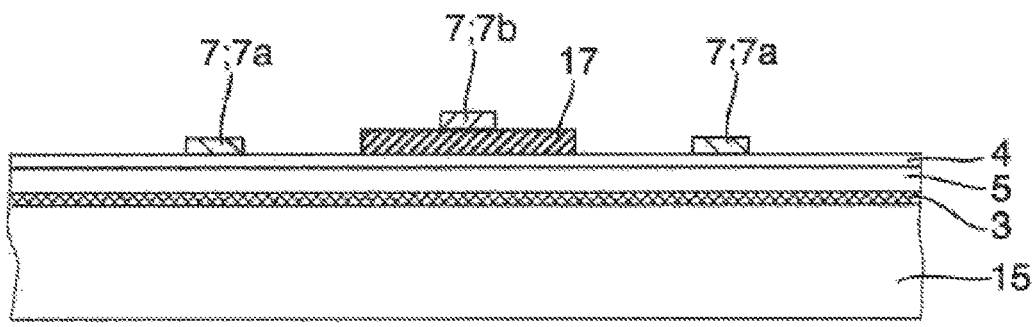
FIG. 14 shows a sectional view along a line XIV-XIV in FIG. 6.
Figure 15:
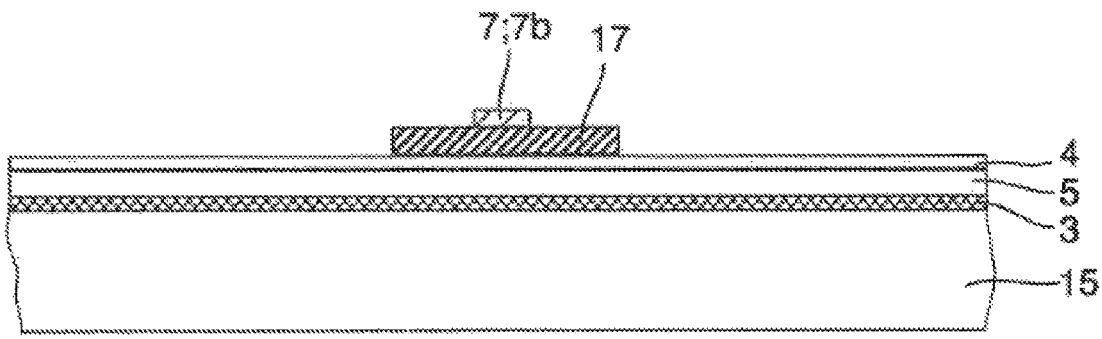
FIG. 15 shows a sectional view along a line XV-XV in FIG. 6.
Figure 16:
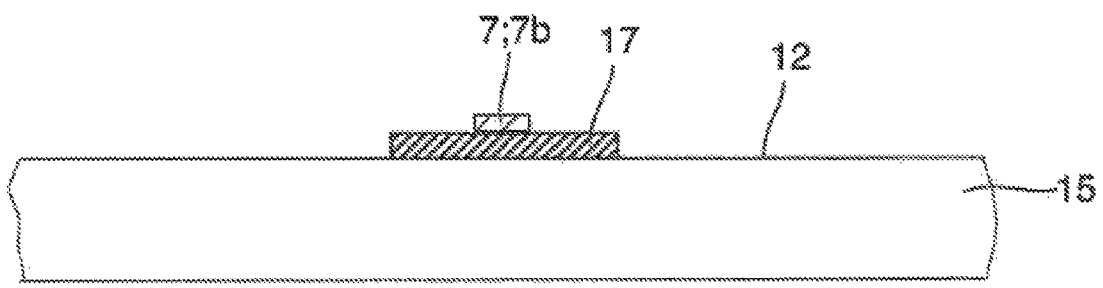
FIG. 16 shows a sectional view along a line XVI-XVI in FIG. 6.

In the embodiment variant in which the respective contact strip 7 contacts the rear contact layer 3 of the solar cell 2 only in a quasi-punctiform manner in the one or more contact sections 14 spaced apart from one another to form corresponding contact pads or contact points, the insulating layer 17 is provided between the contact sections 14 in the connecting strip regions 8 between the front contact layer 4 and the contact strip 7 in order to keep the contact strip 7 electrically insulated from the front contact layer 4 in this region. The insulating layer 17 can in turn be provided in a layer deposition process or alternatively by a paste material or a prefabricated electrically insulating strip/tape material. In an advantageous manufacturing variant, the insulating layer 17 can be applied or attached continuously over the front contact layer 4 in the connecting strip region 8 of the relevant solar cell 2, after which via openings 9a are introduced into the insulating layer 17 in the region of the contact sections 14, as can be seen in FIG. 8. In any case, it is expedient in this case to use a light-transparent material for the insulating layer 17 in order to avoid corresponding light losses through the insulating layer 17 even in regions in which the insulating layer 17 is not covered by the contact strip 7, if for example, as in the example shown in the connecting strip region 8, it extends laterally beyond each of the applied contact strips 7 on the front contact layer 4.

In corresponding embodiments, the contact strips 7 are components that are manufactured separately from the monolithic solar cell array 1 and attached to the monolithic solar cell array 1. For this purpose, the contact strips 7 can be prefabricated, for example, as corresponding contact wires or contact tapes, as already mentioned above. Alternatively, the contact strips 7 are formed by a screen printing process from a suitable electrically conductive paste material with a subsequent drying or firing process, or by a layer deposition process in which a corresponding electrically conductive material is applied as a layer, after which this layer is structured into the contact strips 7, for example by typical photolithographic and etching processes. Numerous, preferably metallic materials are suitable for the contact strips 7, such as copper (Cu), for example as an optionally tinned strip material, silver (Ag), gold (Au), aluminum (Al), nickel (Ni), and alloys made up of several of these and/or other metals.

In advantageous embodiments, as in the example shown, a first solar cell $2_{m-1}$ and a third solar cell $2_{m+1}$ adjoin a second solar cell $2_m$ on opposite sides, wherein the first solar cell $2_{m-1}$ and the second solar cell $2_m$ are electrically connected in series by one or alternatively, as shown, multiple first contact strips 7a and the second solar cell $2_m$ and the third solar cell $2_{m+1}$ are electrically connected in series by one or, as shown, multiple second contact strips 7b. Each first contact strip 7a contacts the side 3a of the rear contact layer 3 of the first solar cell $2_{m-1}$ facing toward the absorber layer 5 and the side 4b of the front contact layer 4 of the second solar cell $2_m$ facing away from the absorber layer 5. Each second contact strip 7b contacts the side 3a of the rear contact layer 3 of the second solar cell $2_m$ facing toward the absorber layer 5 and the side 4b of the front contact layer 4 of the third solar cell $2_{m+1}$ facing away from the absorber layer 5. In the region of the second solar cell $2_m$, at least one first contact strip 7a and one second contact strip 7b extend in such a way that they overlap in the direction transverse to the series connection direction RS. This overlapping extension results in an interlocking structure of the first contact strips 7a on the one hand and the second contact strips 7b on the other hand on each solar cell 2, as can be seen in particular from FIGS. 1 to 3, 5, and 6. This enables the surface area of the solar cells 2 to be optimally included by the contact strips 7. As a result, electrical charges generated at any point in the absorber layer 5 of the solar cells 2 can travel on a relatively short path to the front contact layer 4 or rear contact layer 3 and from there to the contact strips 7.

In alternative embodiments, a first and a third solar cell do not adjoin a second solar cell on opposite sides, but instead, for example, on two adjacent sides of the second solar cell. In this case, the series connection directions for the electrical serial connection of the first and the second solar cell on the one hand and the second and third solar cell on the other hand differ. For example, these two series connection directions can then extend perpendicularly to one another or obliquely to one another at an acute angle.

In corresponding embodiments, as in the examples shown, the first contact strips 7a are arranged with equal transverse distance QA1 from one another in the region of a respective solar cell 2. In advantageous implementations, the transverse distance QA1 of the first contact strips 7a from one another is between 10 mm and 100 mm. In alternative embodiments, the first contact strips 7a can be arranged with different transverse distances.

In corresponding embodiments, as in the examples shown, the second contact strips 7b are arranged with equal transverse distance $QA_2$ from one another. In advantageous implementations, the transverse distance $QA_2$ of the second contact strips 7b from one another is between 10 mm and 100 mm. In alternative embodiments, they can be arranged with different transverse distances.

In corresponding embodiments, as in the examples shown, the first contact strips 7a and the second contact strips 7b are arranged alternating with equal transverse distance $QA_{12}$ from one another. In advantageous implementations, the transverse distance $QA_{12}$ of the first and second contact strips 7a, 7b from one another is between 5 mm and 50 mm. In alternative embodiments, they can be arranged with different transverse distances and/or in a non-alternating sequence in the transverse direction.

Figure 4:
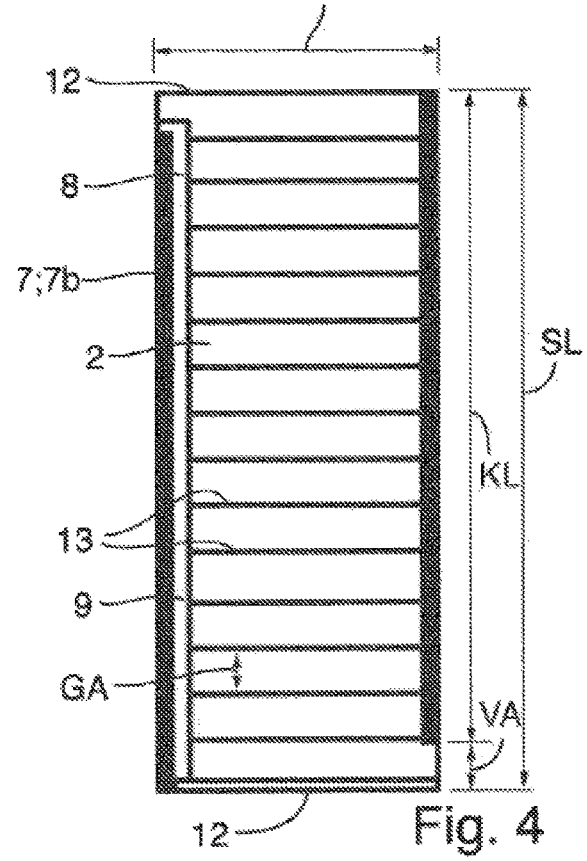
Figure 5:
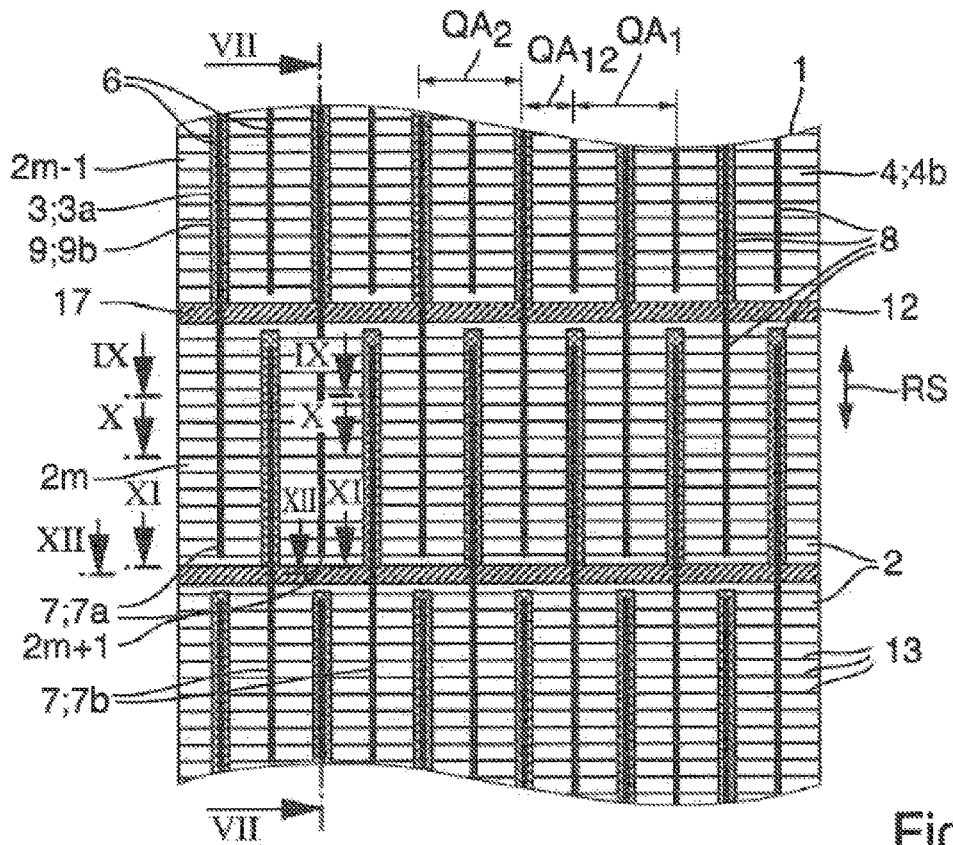
Figure 6:
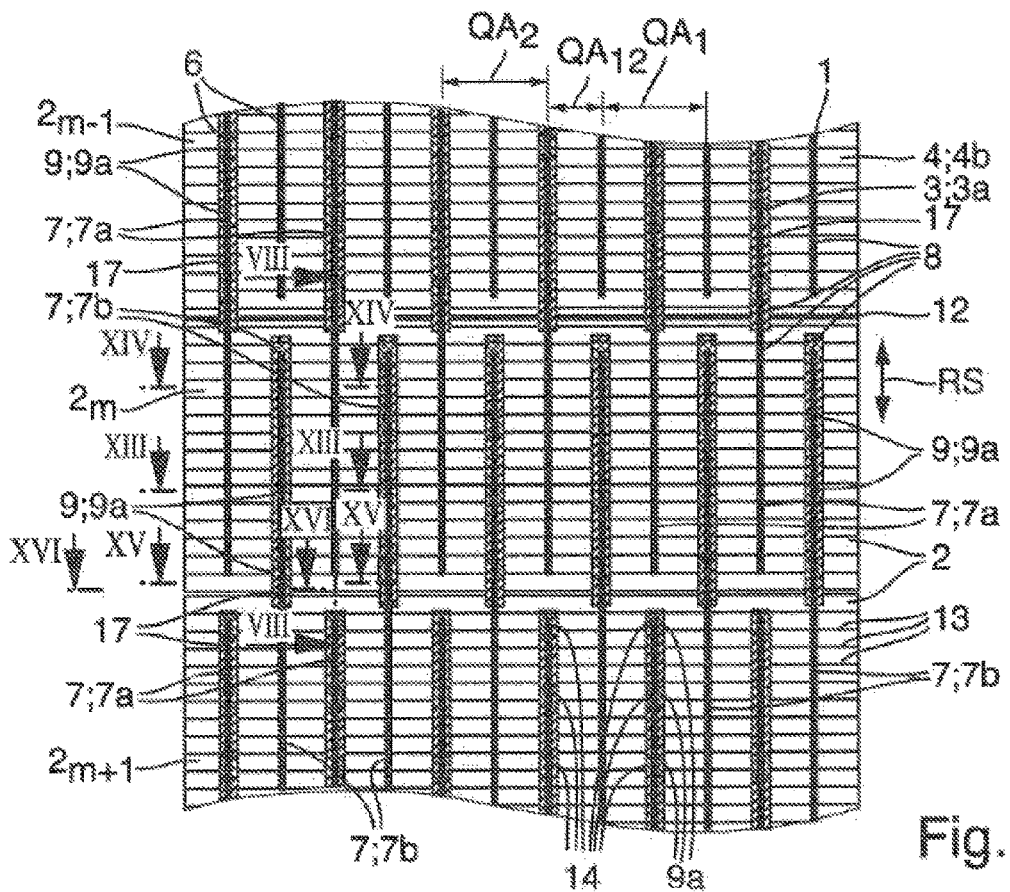
Figure 7:
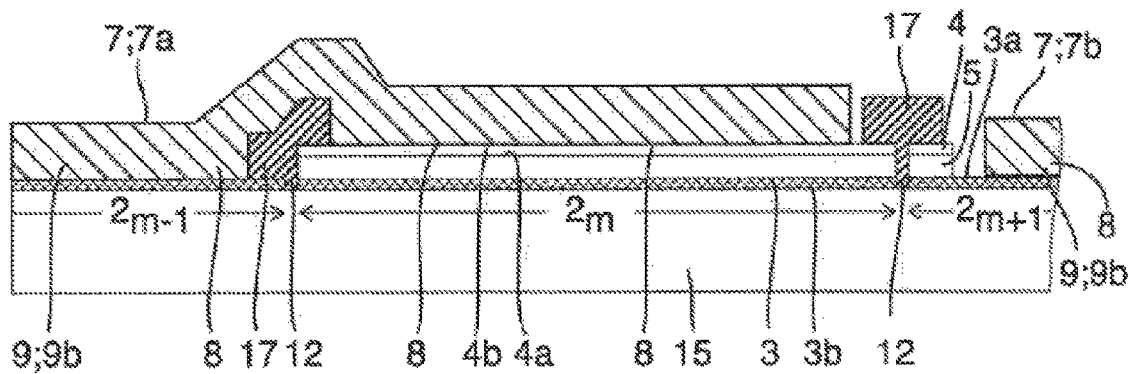

In advantageous embodiments, the contact strips 7 extend as in the example shown in the region of a respective solar cell 2 with a strip length KL, marked in FIG. 4, that is at least 50% of the longitudinal extension SL of the solar cell 2 in the extension direction of the contact strips 7, i.e., the cell width ZB. The strip length KL of the contact strips is preferably at least 80% of the linear extension SL of the solar cell 2. In the variant having continuous rear contact layer contacting in the respective connecting trench 9b, this also applies to the length of the connecting trench 9b or to the continuous contact surface of the contact strip 7 with the rear contact layer 3. It can also be provided that the contact strips 7 or the connecting trench 9b each end at a predefinable distance in the range of, for example, 1 mm to 15 mm from the adjacent solar cell or from the relevant separating strip region 12. In corresponding embodiments, the cell width ZB, i.e., the longitudinal extension SL of the respective solar cell 2 in the extension direction of the contact strips 7, is between 10 mm and 300 mm.

In advantageous implementations, the contact strips 7 extend in the region of a respective solar cell 2 at least with their strip section contacting the front contact layer 4 having a strip length KL that is less than the longitudinal extension SL of the solar cell 2 in the extension direction, i.e., the cell width ZB, by a shortening distance VA that is less, at most twice as large as a grid spacing GA of a contact grid structure 13, with which the front contact layer 4 is optionally provided in a manner conventional per se, as in the examples shown. In this case, the contact strips 7 can be attached over the contact grid structure 13 that has already been formed. Alternatively, the contact strips 7 can be attached first, before the contact grid structure 13 is then formed.

Figure 17:
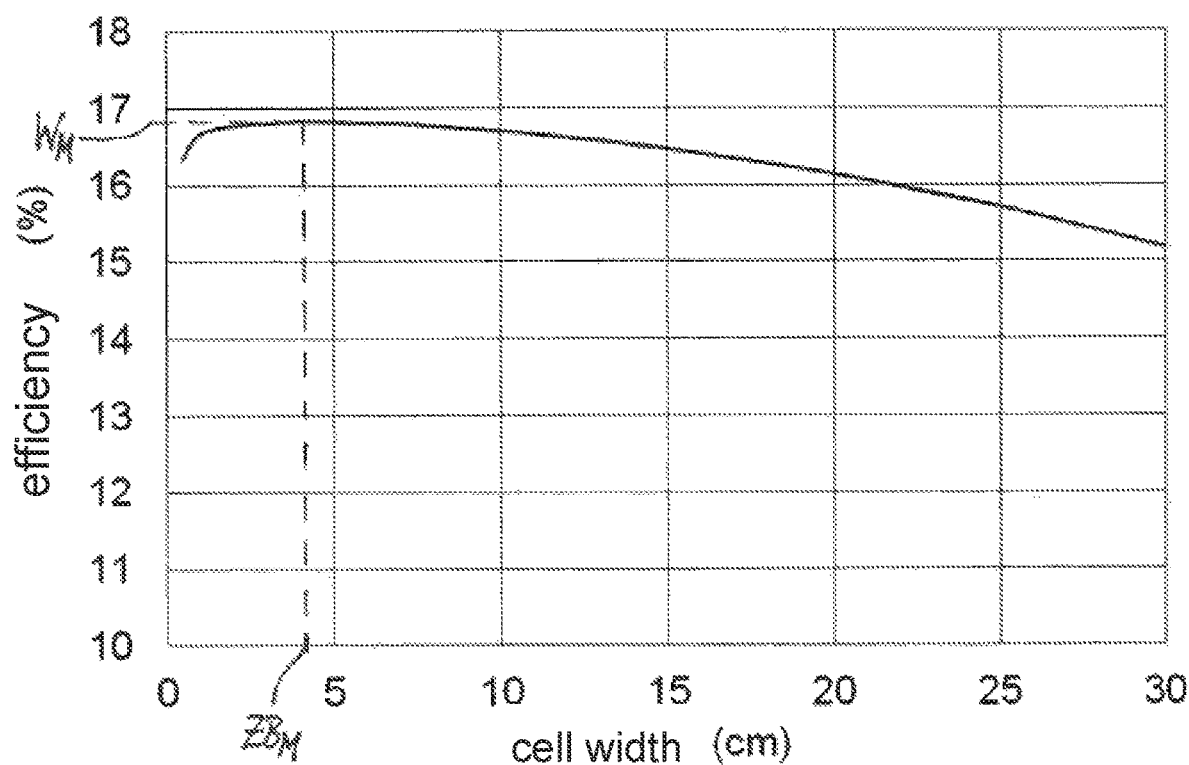
FIG. 17 shows a diagram of the module efficiency as a function of the cell width for an exemplary module design.

FIG. 17 shows the determined functional progression of the efficiency of the photoelectric conversion for the thin film solar module with varied cell breadth or cell width in diagram form for a typical, exemplary module design, wherein the cell width is abbreviated as cell width in FIG. 17. The determination of this progression or this characteristic curve can be verified both by computational simulation and by a corresponding series of experimental tests, wherein the efficiency is understood to mean the efficiency determined as usual under so-called STC conditions. It is obvious that the progression of the efficiency shown diagrammatically for a special module design according to the invention, indicated as usual in percent, was determined as a function of the cell width, indicated in centimeters, while keeping the other module parameters constant.

Apart from the characteristic series connection structure, this module design is based on typical module parameters. A molybdenum material was thus chosen for the rear contact layer 3, a zinc oxide material for the front contact layer 4, and a CIGS material for the absorber layer 5. The electrical sheet resistances were 0.6Ω/sq for the molybdenum rear contact layer and 75Ω/sq for the ZnO front contact layer. Furthermore, a contact finger structure having a finger width of 0.0073 cm and a finger spacing of 0.15 cm was used. A width and a thickness of the respective contact strip 7 of 0.03 cm each were selected for the characteristic contact strip structure, wherein the longitudinal extension of the contact strip 7 is adapted to the change of the cell width ZB in such a way that a distance of the respective contact strip 7 at each of its two ends from the adjacent separating region 12 remains constant, for example a uniform distance between the contact strip 7 and the adjacent separating region 12 of approximately 2 mm at both ends of the contact strip 7. The length/width ratio of the respective connecting trench 9b or the contact surface of the respective contact strip 7 to the rear contact layer 3 is in the case of a cell width between 0.5 cm and 30 cm in the range between approximately 15:1 and approximately 1,000:1. As can be seen from FIG. 17, a maximum $W_M$ of the efficiency of slightly more than 16.8% at a cell width $ZB_M$ of approximately 4 cm results for this module design. This result is remarkable insofar as the maximum efficiency of conventional module designs is at a significantly lower cell width, typically in the range of cell widths between 0.1 cm and 1.5 cm.

Another result that can be seen from FIG. 17 is the comparatively flat curve of the characteristic curve for the efficiency with varied cell width. On the one hand, at a cell width ZB of approximately 0.7 cm and on the other hand, especially at a relatively large cell width ZB of approximately 15 cm, an efficiency of approximately 16.5% still results in each case, which corresponds to a reduction in relation to the maximum efficiency $W_M$ of only approximately 0.3% in absolute terms and just under 2% in relative terms of the maximum value $W_M$. This contrasts significantly with conventional module designs, which only work with series connection structures on the cell edge or with at most short contact strips. Although these module designs can have a similarly large efficiency maximum, as mentioned, usually at significantly smaller cell widths below 1.5 cm, there is a much stronger drop in efficiency, starting from this maximum, particularly in the direction of greater cell widths.

For example, for a module design used for comparison with conventional P1-P2-P3 structuring instead of the contact strip structure according to the invention, with otherwise identical module parameters, there is a comparably high maximum efficiency, but for a cell width ZB of approximately 0.6 cm, and the efficiency drops quickly with greater cell width ZB and only still reaches a value of approximately 10% at a cell width ZB of 4 cm. For another comparative example with short contact strips, which extend only slightly, for example over a maximum length of approximately 8 mm from the separating strip region to the respective solar cell, there is a maximum efficiency of approximately 16% for a cell width ZB of approximately 3 cm, for otherwise identical module parameters, with again a relatively steep drop in efficiency at greater cell width ZB to a value of less than 5% in absolute terms for a cell width ZB of 15 cm.

It is to be noted at this point that in the example under consideration in FIG. 17, even for a cell width of 30 cm, an efficiency of slightly more than 15% still results, which in absolute terms is therefore still only approximately 1.7% below the maximum value, i.e., only 10% below the maximum value in relative terms. This therefore clearly shows the advantages of the electrical connection structure according to the invention having the characteristic contact strips 7, when these extend over a significant part of the cell width ZB of the solar cells.

For the example in FIG. 17, a module design was selected in that variant in which the respective contact strip 7 continuously contacts the rear contact layer 3 of the relevant solar cell 2 along its extension and is introduced into the associated connecting trench 9b for this purpose. However, it has been shown that the variant with punctiform contacting of the rear contact layer 3 via the associated via openings 9a at equal length of the contact strips 7 has essentially the same properties with respect to efficiency as a function of the cell width ZB, i.e., a maximum efficiency at a relatively large cell width ZB of more than 2 cm and a relatively flat progression of the characteristic curve, in particular towards the side of increasing cell width ZB.

As the exemplary embodiments shown and those explained further above make clear, the invention provides a thin film solar module that can be produced with relatively little effort and makes it possible to achieve a high solar module efficiency, wherein the current transport losses can in particular also be kept comparatively low. The specific electrical connection structure using the special contact strips makes a significant contribution to this The front contact layer is contacted via the contact strips, optionally assisted by a conventional front contact grid structure. The rear contact layer is exposed from the front side, i.e., on its side facing toward the absorber layer, for which purpose the absorber layer is formed or removed in a correspondingly structured manner, and contacted by means of the contact strips. With an interlocking arrangement of the contact strips, the length of the current paths can be kept very short, which accordingly keeps the ohmic resistance losses low.

In this way, the invention enables or facilitates the production of relatively large-area solar cells with low area losses and low module voltages without undesired electrical losses due to long current paths within the front contact layer and the rear contact layer. By contacting the front contact layer and the rear contact layer over practically the entire longitudinal extension or at least over a large part of the longitudinal extension of the solar cells, electrical losses during current extraction and current injection are also minimized.

The invention claimed is:

1. A thin film solar module having
a monolithic solar cell array, which includes a plurality of solar cells having a layered structure that has a rear contact layer, a front contact layer, and an absorber layer between the rear contact layer and the front contact layer; and
an electrical connection structure having contact strips for electrically connecting in series solar cells arranged adjacent to one another, wherein the electrical connection structure electrically connects in series each two solar cells ($2_m$, $2_{m+1}$) adjoining in a series connection direction by one or more contact strips;
wherein the contact strips are spaced apart from one another transversely to the series connection direction and extend with a directional component in the series connection direction in connecting strip regions of the solar cells and each contact strip contacts a side of the rear contact layer of solar cell ($2_m$) facing toward the absorber layer and a side of the front contact layer of solar cell ($2_{m+1}$) facing away from the absorber layer, wherein the connecting strip regions of the solar cells have connecting openings in the front contact layer and the absorber layer to expose the side of the rear contact layer facing toward the absorber layer;
wherein a solar cell ($2_{m-1}$) and solar cell ($2_{m+1}$) adjoin solar cell ($2_m$) on opposite sides, wherein solar cell ($2_{m-1}$) and solar cell ($2_m$) are electrically serially connected by one or more first contact strips and solar cell ($2_m$) and solar cell ($2_{m+1}$) are electrically serially connected by one or more second contact strips and each of the first contact strips contacts the side of the rear contact layer of solar cell ($2_{m-1}$) facing toward the absorber layer and the side of the front contact layer of the solar cell ($2_m$) facing away from the absorber layer, and each of the second contact strips contacts the side of the rear contact layer of solar cell ($2_m$) facing toward the absorber layer and the side of the front contact layer of solar cell ($2_{m+1}$) facing away from the absorber layer, and
wherein, in the region of solar cell ($2_m$), at least one first and one second contact strip extend overlapping in the direction transverse to the series connection direction; and
wherein the respective contact strip extends in the connecting strip region in a connecting trench of solar cell ($2_{m+1}$) that forms the connecting opening and contacts the rear contact layer of solar cell ($2_m$) continuously along its extension over the rear contact layer and extends between the two solar cells over a separating strip region separating them, with an insulating layer interposed, and wherein the respective contact strip is attached as a prefabricated wire or tape material and/or its contact surface to the rear contact layer has a length/width ratio of at least 3:1; or
wherein the respective contact strip extends in the connecting strip region with an insulating layer interposed on the front contact layer of solar cell ($2_m$) and contacts the rear contact layer of solar cell ($2_m$) along its extension in one or more contact sections spaced apart from one another, in which the connecting opening in the connecting strip region forms a via opening in each case.

2. The thin film solar module of claim 1, wherein
A cell width of the respective solar cell in the series connection direction is in a range of 1 cm to 30 cm.

3. The thin film solar module of claim 1, wherein, in the region of a respective solar cell, the first contact strips are arranged at equal transverse distance from one another and/or the second contact strips are arranged at equal transverse distance from one another and/or the first and the second contact strips are arranged alternating at equal transverse distance from one another.

4. The thin film solar module of claim 3, wherein
the transverse distance of the first contact strips from one another is between 10 mm and 100 mm; and/or
the transverse distance of the second contact strips from one another is between 10 mm and 100 mm; and/or
the transverse distance of the first and second contact strips from one another is between 5 mm and 50 mm.

5. The thin film solar module of claim 1, wherein the solar cell array has a substrate layer on which the solar cells are arranged jointly with their rear contact layer facing toward the substrate layer, wherein each two adjacent and electrically serially connected solar cells are separated from one another in their layer structure by a separating strip region and the contact strips extend beyond their separating strip region for the electrical series connection of the two solar cells.

6. The thin film solar module of claim 1, wherein the contact strips are components that are manufactured separately from the monolithic solar cell array and attached to the monolithic solar cell array.

7. The thin film solar module of claim 1, wherein
the contact strips extend in the region of a respective solar cell with a strip length that is at least 50% of the longitudinal extension of the solar cell in the extension direction of the contact strips; and/or
the contact strips extend in the region of a respective solar cell with their strip section contacting the front contact layer having a strip length that is less than the longitudinal extension of the solar cell in the extension direction of the contact strips by a shortening distance that is at most twice as large or at most as large as a grid spacing of a contact grid structure of the front contact layer.

8. The thin film solar module of claim 7, wherein the longitudinal extension of the respective solar cell in the extension direction of the contact strips is between 10 mm and 300 mm.

9. A thin film solar module comprising:
a monolithic solar cell array, which includes a plurality of solar cells having a layered structure that has a rear contact layer, a front contact layer, and an absorber layer between the rear contact layer and the front contact layer; and an electrical connection structure having contact strips for electrically connecting in series solar cells arranged adjacent to one another, wherein the electrical connection structure electrically connects in series each two solar cells ($2_m$, $2_{m+1}$) adjoining in a series connection direction by one or more contact strips;

wherein the contact strips are spaced apart from one another transversely to the series connection direction and extend with a directional component in the series connection direction in connecting strip regions of the solar cells and each contact strip contacts a side of the rear contact layer of solar cell ($2_m$) facing toward the absorber layer and a side of the front contact layer of solar cell ($2_{m+1}$) facing away from the absorber layer, wherein the connecting strip regions of the solar cells have connecting openings in the front contact layer and the absorber layer to expose the side of the rear contact layer facing toward the absorber layer;

wherein the respective contact strip extends in the connecting strip region in a connecting trench of solar cell ($2_{m+1}$) that forms the connecting opening and contacts the rear contact layer of solar cell ($2_m$) continuously along its extension over the rear contact layer and extends between the two solar cells over a separating strip region separating them, with an insulating layer interposed, and wherein the respective contact strip has a contact surface and the contact surface to the rear contact layer has a length/width ratio of at least 3:1;

wherein a solar cell ($2_{m-1}$) and solar cell ($2_{m+1}$) adjoin solar cell ($2_m$) on opposite sides, wherein solar cell ($2_{m-1}$) and solar cell ($2_m$) are electrically serially connected by one or more first contact strips and solar cell ($2_m$) and solar cell ($2_{m+1}$) are electrically serially connected by one or more second contact strips and each of the first contact strips contacts the side of the rear contact layer of solar cell ($2_{m-1}$) facing toward the absorber layer and the side of the front contact layer of the solar cell ($2_m$) facing away from the absorber layer, and each of the second contact strips contacts the side of the rear contact layer of solar cell ($2_m$) facing toward the absorber layer and the side of the front contact layer of solar cell ($2_{m+1}$) facing away from the absorber layer, and wherein, in the region of solar cell ($2_m$), at least one first and one second contact strip extend overlapping in the direction transverse to the series connection direction.

10. The thin-film solar module of claim 9, wherein:
a cell width is between 0.5 cm and 30 cm; and
the length/width ratio of the contact surface of the contact strip to the rear contact layer is in a range between 15:1 and 1,000:1.

11. The thin-film solar module of claim 9, wherein a cell width of the respective solar cell in the series connection direction is in a range of 2 cm to 20 cm.

12. The thin-film solar module of claim 9, wherein the contact strips comprise a prefabricated wire or strip material.

13. The thin-film solar module of claim 9, wherein the contact strips in the area of a respective solar cell extend with a strip length which is greater than 50%, and less than 100%, of a length extension of the solar cell in the direction of extension of the contact strips.

14. The thin-film solar module of claim 9, wherein the contact strips in the area of a respective solar cell extend with a strip length which is greater than 80%, and less than 100%, of a length extension of the solar cell in the direction of extension of the contact strips.

15. The thin-film solar module of claim 9, wherein the contact strips are spaced apart from one another transversely to the series connection direction, and having a transverse spacing distance in a range between 5 mm and 100 mm.

16. The thin-film solar module of claim 9, wherein the absorber layer comprises a CIGS (copper indium gallium diselenide) material.

17. The thin film solar module of claim 9, wherein a cell width of the respective solar cell in the series connection direction is in a range of 1 cm to 30 cm.

18. The thin film solar module of claim 9, wherein the contact strips extend in the region of a respective solar cell with a strip length that is at least 50% of the longitudinal extension of the solar cell in the extension direction of the contact strips.

19. The thin film solar module of claim 9, wherein the contact strips extend in the region of a respective solar cell with their strip section contacting the front contact layer having a strip length that is less than the longitudinal extension of the solar cell in the extension direction of the contact strips by a shortening distance that is at most twice as large or at most as large as a grid spacing of a contact grid structure of the front contact layer.

20. The thin film solar module of claim 19, wherein the longitudinal extension of the respective solar cell in the extension direction of the contact strips is between 10 mm and 300 mm.

* * * * *